United States Patent [19]
D'Anna et al.

[11] Patent Number: 5,821,144
[45] Date of Patent: Oct. 13, 1998

[54] LATERAL DMOS TRANSISTOR FOR RF/ MICROWAVE APPLICATIONS

[75] Inventors: Pablo E. D'Anna, Los Altos; Francois Hébert, Sunnyvale, both of Calif.

[73] Assignee: Spectrian, Inc., Sunnyvale, Calif.

[21] Appl. No.: 951,215

[22] Filed: Sep. 29, 1997

Related U.S. Application Data

[62] Division of Ser. No. 711,495, Sep. 10, 1996.

[51] Int. Cl.$^6$ .................................................. H01L 21/8236
[52] U.S. Cl. ................................. 438/276; 148/DIG. 126
[58] Field of Search ..................................... 438/276, 209, 438/220, 20, 217; 148/DIG. 126

[56] References Cited

U.S. PATENT DOCUMENTS

| | | | |
|---|---|---|---|
| 4,738,936 | 4/1988 | Rice | 437/141 |
| 5,485,027 | 1/1996 | Williams et al. | 257/409 |
| 5,556,796 | 9/1996 | Garnett et al. | 437/31 |
| 5,559,044 | 9/1996 | Williams et al. | 437/34 |
| 5,583,061 | 12/1996 | Williams et al. | 437/34 |
| 5,591,655 | 1/1997 | Blanchard | 437/41 |
| 5,618,743 | 4/1997 | Williams et al. | 438/276 |
| 5,643,820 | 7/1997 | Williams et al. | 437/60 |
| 5,688,725 | 11/1997 | Darwish et al. | 438/270 |

OTHER PUBLICATIONS

Patent Abstracts of Japan, vol. 010, No. 379 (E–465), 18 Dec. 1986 & JP 61 172371 A (Matsushita Electric Ind Co Ltd), 4 Aug. 1986, see abstract; figures.

Ishiwaka O et al; "A 2.45 GHz power Ld–MOFSET with reduced source inductance by V–groove connections", International Electron Devices Meeting. Technical Digest (Cat. No. 85CH2252–5), Washington, DC, USA, 1–4 Dec. 1985, New York, NY, USA, IEEE, USA, pp. (S) 166–169 XP002045942.

Patent Abstracts of Japan, vol. 015, No. 470 (E–1139), 28 Nov. 1991 & JP 03 203377 A (NEC Corp), 5 Sep. 1991. see abstract.

Patent Abstracts of Japan, vol. 018, No. 461 (E–1597), 26 Aug. 1994 & JP 06 151846 A (Toshiba Corp), 31 May 1994. see abstract.

Efland T: "Lateral DMOS Structure Development for Advanced Power Technologies" 1 Mar. 1994, Texas Instruments Technical Journal, vol. 11, NR. 2, pp. (S) 10–24 XP000570018. See figure 2B.

DE 38 16 002 A (Int Rectifier Corp) 8 Dec. 1988 see column 10, line 57 —line 63; figure 6.

Patent Abstracts of Japan, vol. 009, No. 298 (E–361), 26 Nov. 1985 & JP 60 136377 A (Hitachi Seisakusho KK), 19 Jul. 1985, see abstrac.

*Primary Examiner*—John Niebling
*Assistant Examiner*—Michael S. Lebentritt
*Attorney, Agent, or Firm*—Townsend and Townsend and Crew, LLP; Henry K. Woodward

[57] ABSTRACT

An IGFET device (lateral DMOS transistor) with reduced cell dimensions which is especially suitable for RF and microwave applications, includes a semiconductor substrate having an epitaxial layer with a device formed in a surface of the epitaxial layer. A sinker contact is provided from the surface to the epitaxial layer to the substrate for use in grounding the source region to the grounded substrate. The sinker contact is aligned with the source region and spaced from the width of the channel region whereby lateral diffusion in forming the sinker contact does not adversely affect the pitch of the cell structure. The reduced pitch increases output power and reduces parasitic capacitance whereby the device is well-suited for low side switches and as an RF/microwave power transistor.

5 Claims, 6 Drawing Sheets

LATERAL DMOS TRANSISTOR FOR RF/MICROWAVE APPLICATIONS

This is a Division of application No. 08/711,495 filed Sep. 10, 1996, the disclosure of which is incorporated by reference.

BACKGROUND OF THE INVENTION

This invention relates generally to semiconductor insulated gate field effect transistors (IGFETS), and more particularly the invention relates to an IGFET device having a grounded source and applicable for RF/Microwave applications.

IGFET devices such as the lateral DMOS transistor are known to have applicability in RF and microwave applications. One such device is an N-channel transistor formed on a P+ substrate in a P– epitaxial layer. A P+ ground contact is formed in the N+ source region and extends to the substrate. A common contact interconnects the source to the ground contact. The grounded source device is particularly applicable to low side switching applications. However, the cell structure has a large pitch due to the lateral diffusion of the deep P+ Sinker ground contact between the source and channel regions.

The present invention provides a lateral DMOS transistor with reduced cell dimensions (pitch), increased output power, and reduced output capacitance.

SUMMARY OF THE INVENTION

In accordance with the invention an IGFET device has reduced cell dimensions which is especially suitable for RF and microwave applications. The structure includes a semiconductor substrate having an epitaxial layer with a device formed in a surface of the epitaxial layer.

More particularly, a source and a drain are formed in spaced apart regions in the epitaxial layer with a channel region therebetween. The channel has a width which is in abutment with the source and drain. A Sinker contact region extends from the surface through the epitaxial layer to the underlying substrate, the Sinker contact region being aligned with the source region and spaced beyond the width of the channel region. This arrangement reduces the pitch of the transistor cell since the Sinker is not between the source and channel as in the prior art. The reduced pitch increases output power and reduces parasitic capacitance. The device is well-suited for low-side switches and as an RF/microwave power transistor.

The invention and objects and pictures thereof will be more readily apparent from the following detailed description and dependent claims when taken with the drawings.

DETAILED DESCRIPTION OF ILLUSTRATED EMBODIMENTS

Figure 1A:
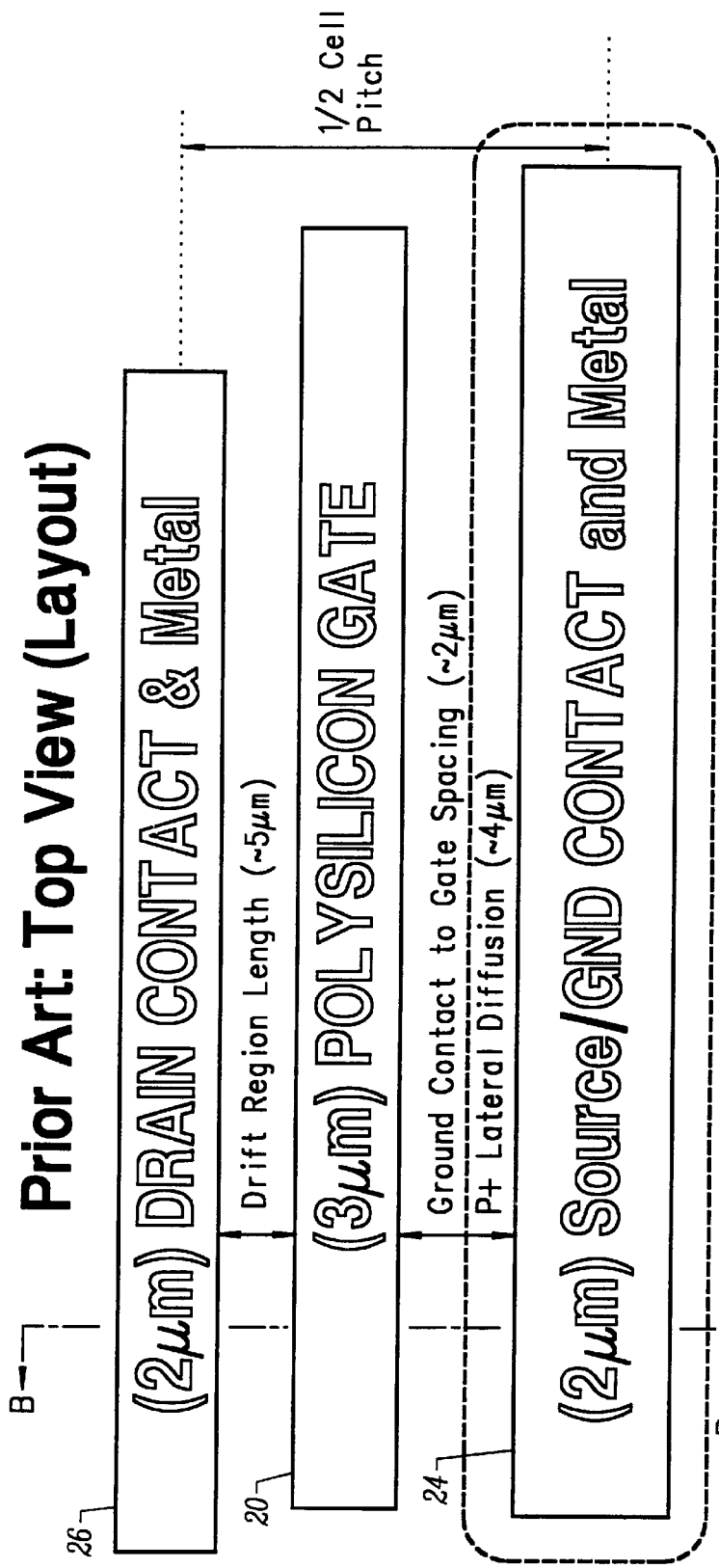
FIGS. 1A, 1B are a plan view and a side view in section of a DMOS transistor in accordance with the prior art.
Figure 1B:
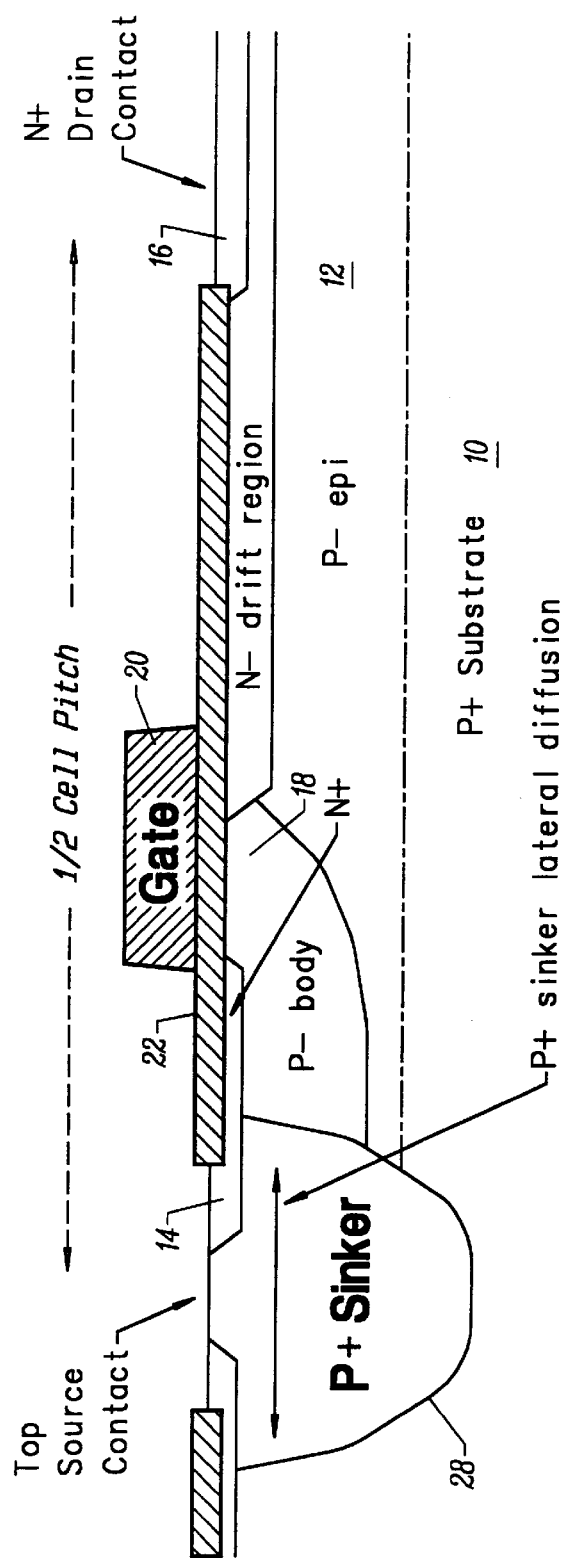

Referring now to the drawings, FIG. 1A is a plan view of a DMOS transistor in accordance with the prior art, and FIG. 1B is a section view taken along the line B—B of FIG. 1A. The device is formed on a P+ silicon substrate 10 in a surface of a P– epitaxial silicon layer 12. The device includes N+ source region 14 and N+ drain region 16 spaced from the source region, with a P– channel region 18 therebetween. A gate 20 is formed on a silicon oxide layer 22 overlying channel region 18. As shown in the plan view of FIG. 1A, a metal contact 24 is made to the source region and a metal contact 26 is made to the drain region.

In accordance with the prior art, a P+ Sinker contact region 28 is formed through the source region 14 and provides a contact to the underlying P+ substrate 10 which in circuit operation is grounded. The metal contact 24 (FIG. 1A) is in contact with both the N+ source region 14 and the P+ Sinker 28 thus providing a contact from the source to the grounded substrate.

However, the lateral diffusion of the deep P+ Sinker diffusion 28 increases the overall dimensions and thus the pitch of the transistor structure. For a P epitaxial layer having a thickness of approximately 5 microns, the P+ Sinker depth must be greater than 5 microns, and the lateral diffusion will then be greater than 4 microns per side for the 5-micron junction or greater than 5 microns per side for a 6-micron junction. One-half cell pitch for the device is equal to one-half the ground contact plus the source—gate space plus the gate plus the drain drift region plus one-half the drain, which is approximately 16 microns or more depending on Sinker depth. Accordingly, the total cell pitch is 32 microns or more depending on the Sinker depth. The cell pitch (repetition dimension) affects the output power and the parasitic capacitance of the device.

Figure 2:
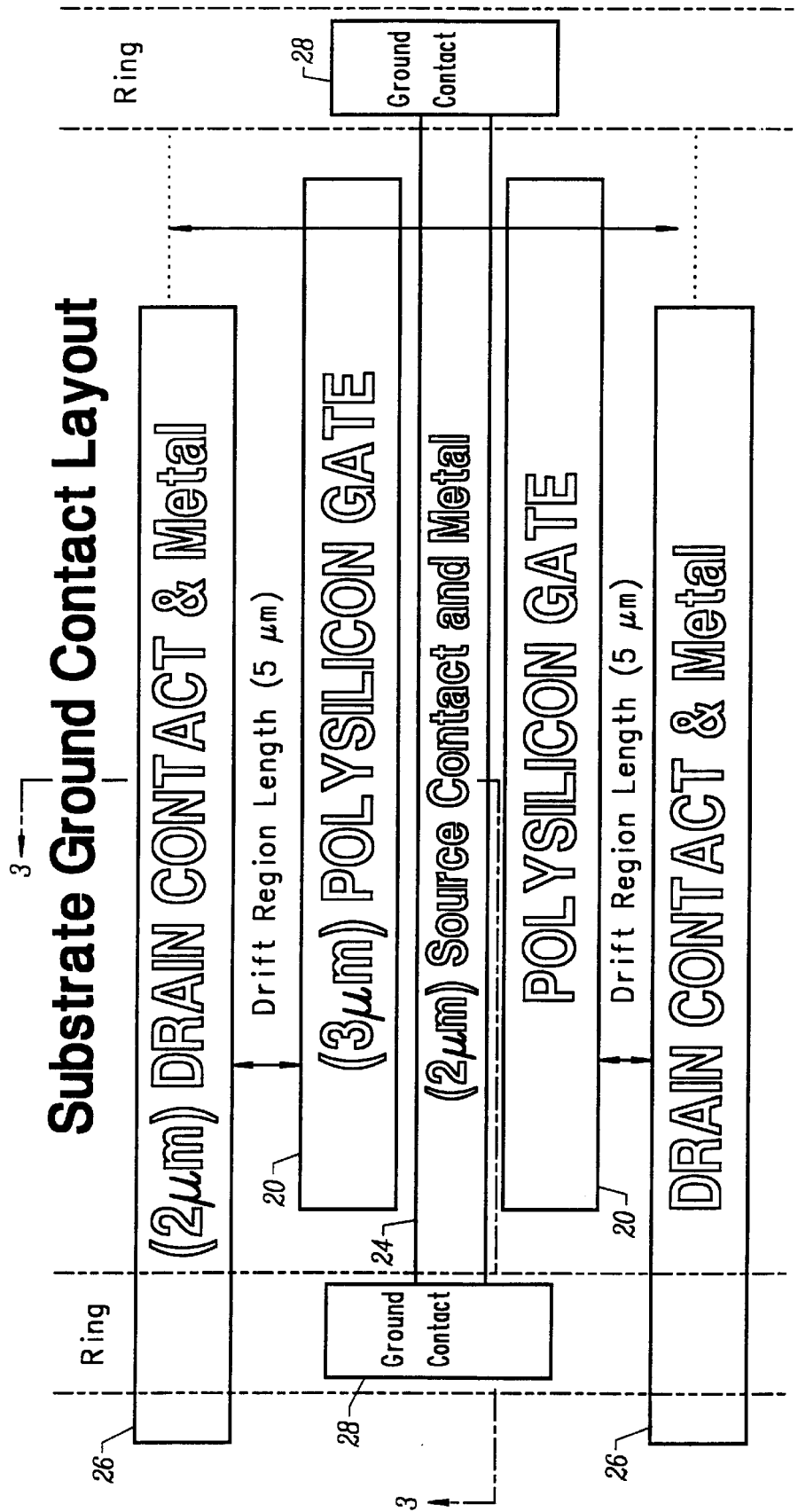
FIG. 2 is a plan view of a DMOS transistor in accordance with the invention.

FIG. 2 is a plan view of a DMOS transistor in accordance with the present invention. The layout is similar to the layout of FIG. 1A, and like elements have the same reference numerals. However, in this embodiment the Sinker contact 28 to the underlying substrate is aligned with the source contact and metal 24 but spaced beyond the width of the gate 20. Advantageously, the ground contact 28 can be made to a ring (shown by a dotted line) which surrounds the active device cells. By removing the Sinker contact region from between the source and channel regions, the lateral diffusion of the Sinker contact 28 does not affect the pitch of the active portion of the cell structure. Using the dimensions given above for FIG. 1A, one-half cell pitch is equal to one-half the source contact plus the source gate space plus the gate length plus the drift region plus one-half the drain contact, or 12 microns. Thus the total cell pitch is 24 microns independent of a Sinker as opposed to the 32 microns cell pitch for the device of FIG. 1A including the Sinker.

Figure 3A:
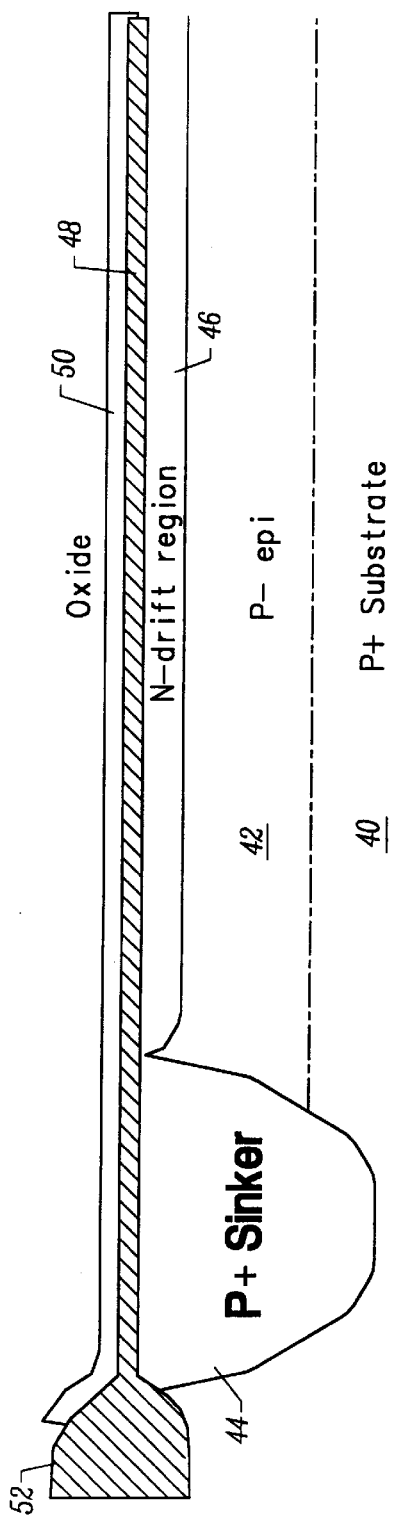
FIGS. 3A–3D are side views in section taken along the line 3—3 of FIG. 2 and illustrates fabrication of the device of FIG. 2.

FIGS. 3A–3D are side views in section taken along the line 3—3 of FIG. 2 and illustrate steps in fabricating the device of FIG. 2. Initially, as shown in FIG. 3A a P+ substrate 40 and P– epitaxial layer 42 are provided as starting material. Alternatively, the substrate and epitaxial layers can be different conductivity types. A deep P+ Sinker Mask and Implant (Boron at 5E15 dose) is performed for source grounding. For a P– or P+ substrate an N– drift region 46 is formed (Arsenic, 5E10-5E12 dose). A thin oxide growth (150 to 1,500Å) 48 followed by silicon nitride deposition (0.05 to 0.2 micron) 50 are formed. An active area mask is formed by etching the nitride where the field oxide 52 will be present. The doped sinker region 44 is driven in at 1,000°–1,270° C. for 60–800 minutes and the field oxide 52 is grown to a thickness of 0.5 to 3 microns.

Figure 3B:
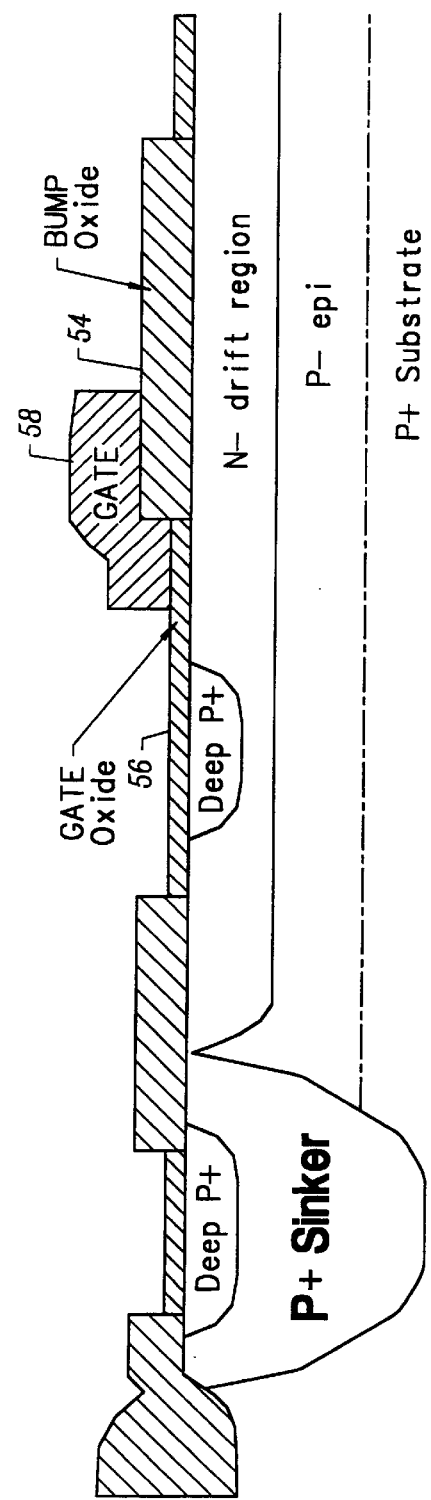

Thereafter, as illustrated in FIG. 3B, the nitride and thin oxide are stripped and a bump oxide 54 is grown to a thickness of 0.3 to 1.0 micron to reduce gate to drain capacitance. Thereafter the oxide is etched over all regions where contacts will be formed, including the source, body, and drain. A deep P+ Mask and Boron Implant (Boron, 1E15-5E15) 56 is typically used to eliminate parasitic bipolar transistor action from the N+ source, P− channel, N− drift region. Following wafer cleaning and gate oxidation (100 to 700 Å) and polysilicon deposition (0.1 to 0.4 micron) the polysilicon gate 58 is formed by etching.

Figure 3C:
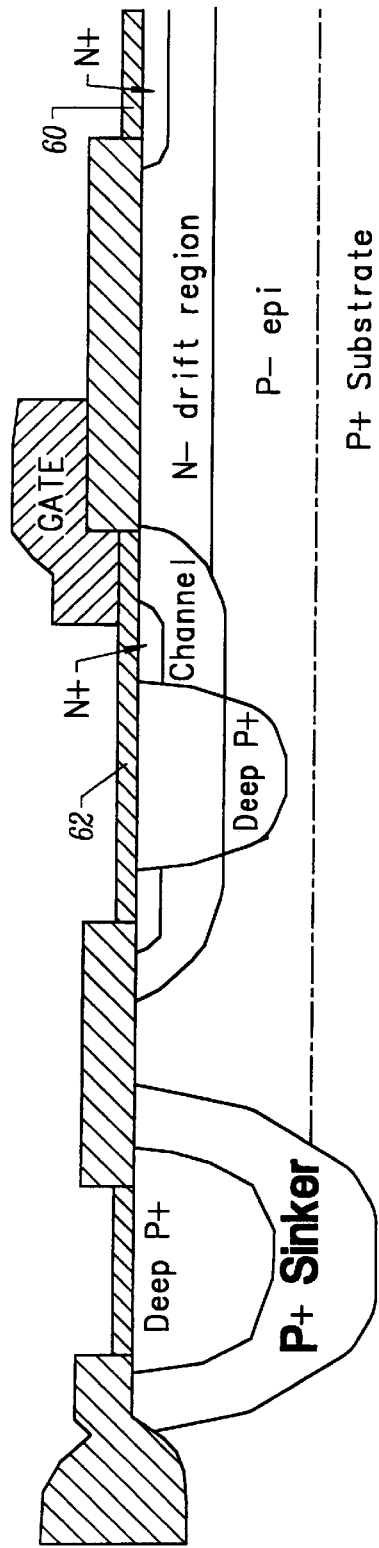

Referring to FIG. 3C, channel doping Boron, 1E13 to 5E14 dose) creates the channel region after drive-in of the channel doping laterally under the gate (950° to 1,150° C., 60 minutes to 800 minutes), with junction depth depending on breakdown voltage requirements and channel length (preferred 0.5 to 1.5 micron). An N+ doping Mask then exposes all regions which will be N+ (drain contact, gate contact, source region) and covers the P+ regions (P+ Sinker, P body). N+ doping (arsenic or phosphorous, 1E15 to 1E16 dose) then forms the drain region 60 and the source region 62.

Figure 3D:
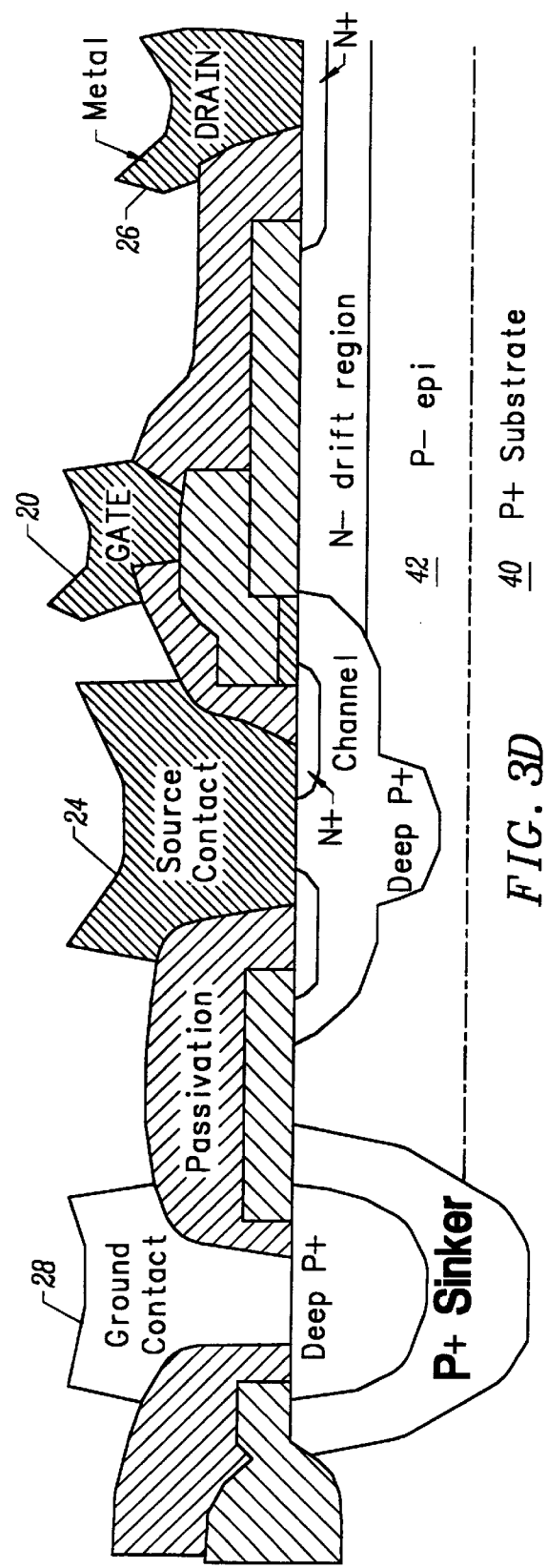

Finally, as shown in FIG. 3D, the device is completed by depositing doped glass (nitride/oxide, BPSG, PSG) with optional reflow for planarization prior to metalization and then metal contact deposition and etch to the exposed source, gate and drain contacts. The metal deposition can be aluminum, Al/1%Si/0.5%Cu, Al with TiW barrier, TiW/Au, and other known metal combinations. The metal mask and etch is followed by final passivation and bond pad patterning.

Figure 4:
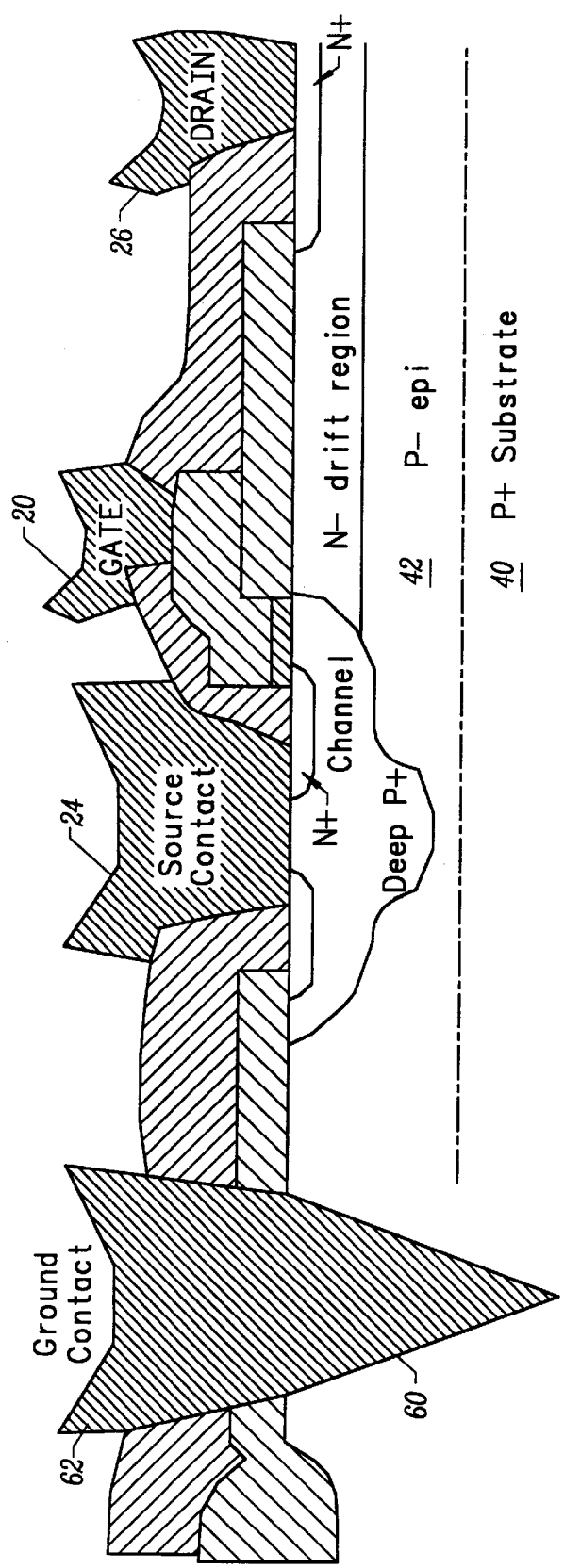
FIG. 4 is a plan view of another embodiment of a DMOS transistor in accordance with the invention.

Variations in the process flow to fabricate the lateral diffused MOS device include use of silicide on the gate polysilicon, elimination of the bump oxide, and the use of different starting material, as noted above. Variations in the ground contact structure can include the use of a trench or V-groove filled with a conductor instead of the use of dopant diffusion, as illustrated in the section view of FIG. 4. This alternative embodiment is similar to the structure of FIG. 3D but the ground contact is formed by filling an etched V-groove 60 with metal 62. The V-groove is readily formed by patterning a V-groove mask and etch after the device passivation. A KOH etch or a reactive ion etch removes the silicon to a depth sufficient to reach the P+ substrate 40. Thereafter, following the contact mask and passivation etch on the gate, drain, source regions, metalization is deposited and selectively etched as shown. Use of the V-groove contact reduces source resistance and also reduces the thermal budget during the fabrication sequence.

There has been described an improved power lateral DMOS device structure with reduced cell pitch, increased output power, and minimized output capacitance in RF/microwave applications. While the invention has been described with reference to specific embodiments, the description is illustrative of the invention and is not to be construed as limiting the invention. Various modifications and applications may occur to those skilled in the art without departing from the true spirit and scope of the invention as defined by the amended claims.

What is claimed is:

1. A method of fabricating a radio frequency insulated gate field effect transistor (IGFET) with grounded source comprising the steps of
    a) providing a semiconductor substrate of a first conductivity type having a doped epitaxial layer thereon with dopant concentration less than that of the substrate, the epitaxial layer having a surface,
    b) forming a source region and a drain region in the surface of the epitaxial layer of a second conductivity type, the source region and drain region being spaced apart by a channel region of the first conductivity type, the channel region having a width parallel to the source region and drain region,
    c) forming a sinker contact region of the first conductivity type from the surface of the epitaxial layer to the substrate, the sinker contact region being aligned with the source region and positioned beyond the width of the channel region,
    d) forming a gate electrode over and spaced from the channel region, and
    e) interconnecting the source region and the sinker contact region.

2. The method as defined by claim 1 wherein step (e) interconnects the source region and the sinker contact region by an interconnect layer over the surface.

3. The method as defined by claim 1 wherein step (a) provides an epitaxial layer of the second conductivity type.

4. The method as defined by claim 1 wherein step (a) provides an epitaxial layer of the first conductivity type, and further including in step (b) the steps of
    i) implanting a drift region in the epitaxial layer of the second conductivity type and extending from the source region to the drain region,
    ii) implanting dopant of the first conductivity type in the source region,
    iii) forming a gate oxide and a gate contact,
    iv) driving dopant of the first conductivity type laterally under the gate contact to form a channel region,
    v) implanting dopant of the second conductivity type in the source region and the drain region to form the source region and drain region,
    vi) forming contacts to the source region, the drain region, the gate, and to the sinker contact region, and
    vii) interconnecting the contact to the source region to the contact to the sinker contact region.

5. The method as defined by claim 4 wherein the first conductivity type is P and the second conductivity type is N.

* * * * *